United States Patent
Burgener, II et al.

(10) Patent No.: US 7,691,353 B2
(45) Date of Patent: Apr. 6, 2010

(54) LOW DIELECTRIC CONSTANT GROUP II-VI INSULATOR

(76) Inventors: Robert H. Burgener, II, 418 W. Winchester St., Murray, UT (US) 84107; Roger L. Felix, 2391 N. 180 West, Pleasant Grove, UT (US) 84062; Gary M. Renlund, 2094 Worchester Dr., Salt Lake City, UT (US) 84121

(*) Notice: Subject to any disclaimer, the term of this patent is extended or adjusted under 35 U.S.C. 154(b) by 1140 days.

(21) Appl. No.: 11/156,264

(22) Filed: Jun. 17, 2005

(65) Prior Publication Data

US 2005/0287817 A1     Dec. 29, 2005

Related U.S. Application Data

(60) Provisional application No. 60/580,454, filed on Jun. 17, 2004.

(51) Int. Cl.
    *H01L 21/00*    (2006.01)
(52) U.S. Cl. .................. 423/265; 423/275; 423/622; 257/614; 438/510; 438/603
(58) Field of Classification Search ............. 423/622, 423/275, 265; 252/62.3 ZT, 62.3 S, 62.3 GA; 257/76, 614; 438/510, 603
    See application file for complete search history.

(56) References Cited

U.S. PATENT DOCUMENTS

| | | | |
|---|---|---|---|
| 3,664,867 A | 5/1972 | Galli et al. | |
| 3,864,725 A | 2/1975 | Merrin | |
| 4,399,441 A | 8/1983 | Vaughn et al. | |
| 5,331,655 A | 7/1994 | Harder et al. | |
| 5,900,060 A * | 5/1999 | Nause et al. | 117/223 |
| 6,057,561 A | 5/2000 | Kayasaki et al. | |
| 6,291,085 B1 | 9/2001 | White et al. | |
| 6,342,313 B1 | 1/2002 | White et al. | |
| 6,410,162 B1 | 6/2002 | White et al. | |
| 6,475,825 B2 | 11/2002 | White et al. | |
| 6,527,858 B1 | 3/2003 | Yoshida et al. | |
| 6,589,362 B2 | 7/2003 | Haga | |
| 6,610,141 B2 | 8/2003 | White et al. | |
| 6,617,183 B2 | 9/2003 | Kadota et al. | |
| 6,624,441 B2 | 9/2003 | Cantwell et al. | |
| 6,664,565 B1 | 12/2003 | Sano et al. | |
| 6,673,478 B2 | 1/2004 | Kato et al. | |
| 6,707,074 B2 | 3/2004 | Yoshii et al. | |
| 6,733,895 B2 | 5/2004 | Kadota et al. | |
| 6,838,308 B2 | 1/2005 | Haga | |
| 6,936,101 B2 * | 8/2005 | Nause et al. | 117/81 |
| 7,141,489 B2 * | 11/2006 | Burgener et al. | 438/478 |
| 2003/0226499 A1 | 12/2003 | Teherani | |
| 2004/0061114 A1 | 4/2004 | Yan et al. | |
| 2004/0099876 A1 | 5/2004 | Niki et al. | |
| 2004/0108505 A1 | 6/2004 | Tuller et al. | |
| 2004/0175860 A1 | 9/2004 | Park et al. | |

FOREIGN PATENT DOCUMENTS

| | | |
|---|---|---|
| EP | 1219731 A1 | 7/2002 |
| JP | 2002068890 | 3/2002 |

OTHER PUBLICATIONS

Aulbur, W.; Density Functional Theory: Basic Ideas & Applications; Ohio State University.

Look, D.C., and Claflin, B.; P-type doping and devices based on ZnO; Aug. 2003; Wiley-VCH Verlag GmbH & Co.

Zunger, A.; Practical Doping Principles; NCPV and Solar Program Review Meeting 2003; pp. 831-835.

Zhang, S.B., Wei, S.H., and Zunger, A.; Intrinsic *n*-type versus *p*-type doping asymmetry and the defect physics of ZnO; Physical Review B; Jan. 31, 2001; pp. 075205-1-075205-7; vol. 63; The American Physical Society.

Limpijumnong, S., Zhang, S.B., Wei, S-H., and Park C.H; Doping by Large-Size-Mismatched Impurities: The Microscopic Origin of Arsenic- or Antimony-Doped *p*-Type Zinc Oxide; Physical Review Letters; Apr. 16, 2004; vol. 92, No. 15; The American Physical Society.

Yamamoto, T., and Katayama-Yoshida, H.; Solution Using a Codoping Method to *Unipolarity* for the Fabrication of *p*-Type ZnO; Japanese Journal of Applied Physics; Feb. 15, 1999; pp. L 166-L 169; vol. 38; Japanese Journal of Applied Physics Publication Board.

(Continued)

*Primary Examiner*—Steven Bos
(74) *Attorney, Agent, or Firm*—Kirton & McConkie; Evan R. Witt

(57) ABSTRACT

Low dielectric constant group II-VI compounds, such as zinc oxide, and fabrication methods are disclosed. Low dielectric constant insulator materials are fabricated by doping zinc oxide with at least one mole % p-type dopant ion. Low dielectric constant zinc oxide insulator materials are fabricated by doping zinc oxide with silicon having a concentration of at least $10^{17}$ atoms/cm$^3$. Low dielectric zinc oxide insulator materials are fabricated by doping zinc oxide with a dopant ion having a concentration of at least about $10^{18}$ atoms/cm$^3$, followed by heating to a temperature which converts the zinc oxide to an insulator. The temperature varies depending upon the choice of dopant. For arsenic, the temperature is at least about 450° C.; for antimony, the temperature is at least about 650° C. The dielectric constant of zinc oxide semiconductor is lowered by doping zinc oxide with a dopant ion at a concentration at least about $10^{18}$ to about $10^{19}$ atoms/cm$^3$.

8 Claims, 1 Drawing Sheet

OTHER PUBLICATIONS

Park, C.H., Zhang, S.B., and Wei, S-H.; Origin of p-type doping difficulty in ZnO: The impurity perspective; Physical Review B; Aug. 5, 2002; pp. 073202-1-073202-3; vol. 66; The American Physical Society.

Tsukazaki, A., Atsushi, T., Ohtomo, A., Onuma, T., Ohtani, M., Makino, T., et al; Repeated temperature modulation epitaxy for p-type doping and light-emitting diode based on ZnO; Nature Materials; Jan. 2005; pp. 42-46; vol. 4; Nature Publishing Group.

Nonaka, M., Matsushima, S., Mizuno, M., and Kobayashi, K.; Electronic Structure of Group III Elements Dopes into ZnO by Using Molecular Orbital Calculation; Chemistry Letters 2002; Feb. 20, 2002; pp. 580-581; The Chemical Society of Japan.

Wang, L.G., and Zunger, A.; Cluster-Doping Approach for Wide-Gap Semiconductors: The Case of p-type ZnO; Physical Review Letters; Jun. 27, 2003; pp. 256401-1-256401-4; vol. 90, No. 25; The American Physical Society.

Norton, D.P., Heo, Y.W., Ivill, M.P., IP, K., Pearton, S.J., et al; ZnO: growth, doping and processing; Materialstoday; Jun. 2004; Elsevier Ltd.

Lee, E-C., Kim, Y.-S., Jin, Y.-G., and Chang, K.J.; First-Principles Study of p-Type Doping and Codoping in ZnO; Journal of the Korean Physical Society; Dec. 2001; pp. S23-S26; vol. 39.

Morhain, C., Teisseire, M., Vezian, S., Vigue, F., Raymond, F., et al; Spectroscopy of Excitons, Bound Excitons and Impurities in h-ZnO Epilayers; Sep. 30, 2001; pp. 881-885; vol. 229, No. 2; Wiley VCH; Berlin.

Bandyopadhyay, S., Paul, G.K., Roy, R., Sen, S.K., and Sen, S; Study of structural and electrical properties of grain-boundary modified ZnO films prepared by sol-gel technique; Materials Chemistry and Physics; May 17, 2001; pp. 83-91; vol. 74; Elsevier Science B.V.

Wilkinson, J., Xiong, G., Ucer, K.B., and Williams, R.T.; Lifetime and Oscillator Strength of Excitonic Luminescence in Zinc Oxide; Department of Physics, Wake Forest University, Winston-Salem, NC.

Kobayashi, A., Sankey, O.F., and Dow, J.D.; Deep energy levels of defects in the wurtzite semiconductors AlN, CdS, CdSe, and ZnO; Physical Review B; Jul. 15, 1983; pp. 946-956; vol. 28, No. 2; The American Physical Society.

Daneu, N. Reenik, A., and Bernik, S.; Grain Growth Control in $Sb_2O_3$-Doped Zinc Oxide; Journal of the American Ceramic Society; 2003; pp. 1379-1384; vol. 86, No. 8.

Ohyama, M.; Sol-Gel Preparation of Transparent and Conductive Aluminum-Doped Zinc Oxide Films with Highly Preferential Crystal Orientation; Journal of the American Ceramic Society; 1998; pp. 1622-1632; vol. 81, No. 6.

Duan, X.L., Yuan, D.R., Cheng, X.F., Sun, H.Q., Sun, Z.H., et al; Microstructure and Properties of $Co^2$: $ZnAl_2O_4/SiO_2$ Nanocomposite Glasses Prepared by Sol-Gel Method; Journal of the American Ceramic Society; 2005; pp. 399-403; vol. 88, No. 2.

Sohn, K.S., Hwang, D.K., and Myoung, J.M.; Time Integrated/Resolved Photoluminescense of ZnO Films Deposited on Sapphire and GaAs; Japanese Journal of Applied Physics; Dec. 2003; pp. 7376-7378; The Japan Society of Applied Physics.

Sun, X.W.; Optical properties of epitaxially grown zinc oxide films on sapphire by pulsed laser deposition; Journal of Applied Physics; Jul. 1, 1999; pp. 408-411; vol. 86, No. 1; American Institute of Physics.

Burden, A.P., Bishop, H.E., Brierley, M., Friday, J.M., Hood, C., et al.; Incorporating consumer-priced field emitting inks into arrays of triode devices; Solid State Electronics; 2001; pp. 987-996; vol. 45; Printable Field Emitters Ltd.

Minami, T., Miyata, T., Shirai, T., and Nakatani, T.; Electroluminescent Oxide Phosphor Thin Films Prepared by a Sol-gel Process; Mat. Res. Soc. Symp. Proc.; 2000; pp. Q4.3.1-Q4.3.6; vol. 621; Materials Research Society.

Qiu, C., Chen, H., Wong, M., and Kwok, H.S.; Dependence of the Current and Power Efficiencies of Organic Light-Emitting Diode on the Thickness of the Constituent Organic Layers; IEEE Transactions On Electron Devices; Sep. 2001; pp. 2131-2137; vol. 48; IEEE.

Matsuda, T., Kawabe, M., Iwata, H., and Ohzone, T.; Visible Electroluminescence from MOS Capacitors with Si-Implanted $SiO_2$; IEICE Trans. Electron.; Sep. 11, 2002; pp. 1895-1904; vol. E85-C, No. 11.

Ong, H.C., Li, A.S.K., and Du, G.T.; Depth profiling of ZnO thin films by cathodoluminescence; Applied Physics Letters; Apr. 30, 2001; pp. 2667-2669; vol. 78, No. 18; American Institute of Physics.

Washington, P.L., Ong, H.C., Dai, J.Y., and Chang, R.P.H.; Determination of the optical constants of zinc oxide thin films by spectroscopic ellipsometry; Applied Physics Letter; Jun. 22, 1998; pp. 3261-3263; vol. 72, No. 25; American Institute of Physics.

Sekiguchi, T., Ohashi, N., and Yamane, H.; Cathodoluminescence Study on ZnO and GaN; Solid State Phenomena; 1998; pp. 171-182; vols. 63-64; Scitec Publications; Switzerland.

Kouyate, D., Ronfard-Haret, J.-C., and Kossanyi, J.; Photo- and electro-luminescence of rare earth-doped semiconducting zinc oxide electrodes: Emission from both the dopant and the support; Journal of Luminescence; 1991; pp. 205-210; vol. 50; Elsevier Science Publishers B.V.

Kossanyi, J., Kouyate, D., Pouliquen, J., Ronfard-Haret, J.C., Valat, P., et al.; Photoluminescence of Semiconducting Zinc Oxide Containing Rare Earth Ions as Impurities; Journal of Luminescence; 1990; pp. 17-24; vol. 46; Elsevier Science Publishers B.V. (north-Holland).

Wang, Y.G., Lau, S.P., Lee, H.W., Yu, S.F., Tay, B.K., et al.; Photoluminescence study of ZnO films prepared by thermal oxidation of Zn metallic films in air; Journal of Applied Physics; Jul. 1, 2003; pp. 354-358; vol. 94, No. 1; American Institute of Physics.

Yu, S.F., Yuen, C., Lau, S.P., Wang, Y.G., Lee, H.W., et al.; Ultraviolet amplified spontaneous emission from zinc oxide ridge waveguides on silicon substrate; Applied Physics Letter; Nov. 24, 2003; pp. 4288-4290; vol. 83, No. 21; American Institute of Physics.

Xiong, G., Wilkinson, J., Lyles, J., Ucer, K.B., and Williams, R.T.; Luminescence and stimulated emission in zinc oxide nanoparticles, films, and crystals.

Ong, H.C., Dai, J.Y., and Du, G.T.; Studies of electronic structure of ZnO grain boundary and its proximity by using spatially resolved electron energy loss spectroscopy; Applied Physics Letter; Jul. 8, 2002; pp. 277-279; vol. 81, No. 2; American Institute of Physics.

Agne, T., Guan, Z., Li, X.M., Wolf, H., and Wichert, T.; Incorporation of the Donor Indium in Nanocrystalline ZnO; phys. stat. sol.; 2002; pp. 819-823; vol. 229; Wiley-VCH Verlag Berlin GmbH; Berlin.

Qadri, S.B., Kim, H., Horwitz, J.S., and Chrisey, D.B.; Transparent conducting films of $ZnO$-$ZrO_2$: Structure and properties; Journal of Applied Physics; Dec. 1, 2000; pp. 6564-6566; vol. 88, No. 11; American Institute of Physics.

Han, J., Mantas, P.Q., and Senos, A.M.R.; Grain growth in Mn-doped ZnO; Journal of the European Ceramic Society; 2000; 2753-2758; vol. 20.

Jin, Y., Zhang, B. Yang, S., Wang, Y., Chen, J., et al.; Room temperature UV emission of $Mg_xZn_{1-x}O$ films; Solid State Communications; 2001; pp. 409-413; vol. 119; Elsevier Science Ltd.

Petrik, N.G., Alexandrov, A.B., and Vall, A.I.; Interfacial Energy Transfer during Gamma Radiolysis of Water on the Surface of $ZrO_2$ and Some Other Oxides; J. Phys. Chem. B; 2001; pp. 5935-5944; vol. 105; American Chemical Society.

Counio, G., Esnouf, S., Gacoin, T., and Boilot, J.-P.; CdS:Mn Nanocrystals in Transparent Xerogel Matrices: Synthesis and Luminescence Properties; J. Phys. Chem.; 1996; pp. 20021-20026; vol. 100; American Chemical Society.

Stravrev, K., Kynev, K., ST. Nikolov, G., and Dyakovitch, V.A.; Semiempirical Assignment of the Electron Transitions in Manganese(II)-Doped II-VI Compounds; J. Phys. Chem. Solids; 1987; pp. 841-844; vol. 48, No. 9; Pergamon Journals Ltd.

Falcony, C., Ortiz, A., Dominguez, J.M., Farias, M.H., Cota-Araiza, L. et al.; Luminescent Characteristics of Tb Doped $Al_2O_3$ Films Deposited by Spray Pyrolysis; J. Electrochem Soc.; Jan. 1992; pp. 267-271; vol. 139, No. 1; The Electrochemical Society, Inc.

Bachir, S., Kossanyi, J., Sandouly, C., Valat, P., and Ronfard-Haret, J.C.; Electroluminescence of $Dy^{3+}$ and $Sm^{3+}$ Ions in Polycrystalline Semiconducting Zinc Oxide; J. Phys. Chem; 1995; pp. 5674-5679; vol. 99; American Chemical Society.

Bachir, S., Kossanyi, J., and Ronfard-Haret, J.C.; Electroluminescence of $Ho^{3+}$ Ions in a ZnO Varistor-Type Structure; Solid State Communications; 1993; pp. 859-863; vol. 89, No. 10; Elsevier Science Ltd.; Great Britain.

Chakrabarti, S., Ganguli, D., Chaudhuri, S., and Pal, A.K.; Crystalline magnesium oxide films on soda lime glass by sol-gel processing; Meterials Letters; May 2002; pp. 120-123; vol. 54; Elsevier Science B.V.

Arkles, B.; Commercial Applications of Sol-Gel-Derived Hybrid Materials; MRS Bulletin; May 2001; pp. 402-407.

Murray, C.E., Noyan, I.C., and Mooney, P.M.; Mapping of strain fields about thin film structures using x-ray microdiffraction; Applied Physics Letters; Nov. 17, 2003; pp. 4163-4165; vol. 83, No. 20; American Institute of Physics.

Modena, S., Soraru, G.D., Blum, Y., and Raj, R.; Passive Oxidation of an Effluent System: The Case of Polymer-Derived SiCO; Journal of the American Ceramic Society; 2005; pp. 339-345; vol. 88.

Noyan, I.C., Wang, P.-C., Kaldor, S.K., and Jordan-Sweet, J.L.; Deformation field in single-crystal fields semiconductor substrates caused by metallization features; Applied Physics Letters; Apr. 19, 1999; pp. 2352-2354; vol. 74, No. 16; American Institute of Physics.

Noyan, I.C., Jordan-Sweet, J., Liniger, E.G., and Kaldor, S.K.; Characterization of substrate-thin-film interfaces with x-ray microdiffraction; Applied Physics Letters; Jun. 22, 1998; pp. 3338-3340; vol. 72, No. 25; American Institute of Physics.

Tuller, H.L.; ZnO Grain Boundaries: Electrical Activity and Diffusion; Journal of Electroceramics; 1999; pp. 33-40; vol. 4:S1; Kluwer Academic Publishers; Boston.

Westin, G., Ekstrand, A., Nygren, M., Osterlund, R., and Merkelbach, P.; Preparation of ZnO-based Varistors y the Sol-Gel Technique; J. Mater. Chem.; 1994; pp. 615-621; vol. 4.

Wang, M., Yang, X., and Wang., F.; Properties of Sensitive Materials Mainly Composed of ZnO; J. Mater. Sci. Technol.; 2000; p. 204; vol. 16, No. 2.

Baptista, J.L., and Mantas, P.Q.; High Temperature Characterization of Electrical Barriers in ZnO Varistors; Journal of Electroceramics; 2000; pp. 215-224; vol. 4:1; Kluwer Academic Publishers; The Netherlands.

Brankovic, Z. Brankovic, G., Poleti, D., and Varela, J.A.; Structural and electrical properties of ZnO varistors containing different spinel phases; Ceramics International; 2001; pp. 115-122; vol. 27; Elsevier Science Ltd. And Techna S.r.l.

Tanaka, A., and Mukae, K.; Evaluation of Single Grain Boundaries in ZnO: Rare-Earth Varistor by Micro-Electrodes; Key Engineering Materials; 1999; pp. 235-240; vols. 157-158; Trans Tech Publications, Switzerland; CSJ Series-Publications of the Ceramic Society of Japan vol. 1, The Ceramic Society of Japan.

Pandey, R., Jaffe, J.E., and Kunz, A.B., Ab initio band-structure calculations for alkaline-earth oxides and sulfides; Physical Review B; Apr. 15, 1991; pp. 9228-9237; vol. 43, No. 11; The American Physical Society.

Canney, S.A., Sashin, V.A., Ford, M.J., and Kheifets, A.S.; Electronic band structure of magnesium and magnesium oxide: experiment and theory; J. Phys. Condens. Matter; 1999; pp. 7507-7522; vol. 11; IOP Publishing Ltd.

Yamasaki, A., and Fujiwara, T.; Electronic structure of the MO oxides (M=Mg, Ca, Ti, V) in the GW approximation; Physical Review B; 2002; pp. 245108-1-245108-9; vol. 66; The American Physical Society.

Mikajlo, E.A., Sashin, V.A., Nixon, K.L., Seoule De Bas, B., Dorsett, H.E., and Ford, M.J.; Band Structures of the Group I and II Oxides: Using EMS Measurements as a Test of Theoretical Models.

Johnson, P.D.; Some Optical Properties of MgO in the Vacuum Ultraviolet; Physical Review; May 15, 1954; pp. 845-846; vol. 94, No. 4.

Narazaki, A., Tanaka, K., Hirao, K., Hashimoto, T., Nasu, H., et al.; IR and XPS Studies on the Surface Structure of Poled $ZnO-TeO_2$ Glasses with Second-Order Nonlinearity; Journal of the American Ceramic Society; 2001; pp. 214-217; vol. 84.

Schonberger, U., and Aryasetiawan, F.; Bulk and surface electronic structures of MgO; Physical Review B; Sep. 15, 1995; pp. 8788-8793; vol. 52, No. 12; The American Physical Society.

Gonzalez, R., Chen, Y., Sebek, R.M., Williams, G.P., Williams, R.T., et al.; Properties of the 800-nm luminescence band in neutron-irradiated magnesium oxide crystals; Physical Review B; Mar. 1, 1991; pp. 5228-5233; vol. 43, No. 7; The American Physical Society.

Balzer, B., Hagemeister, M., Kocher, P., and Ludwig, J.G.; Mechanical Strength and Microstructure of Zinc Oxide Varistor Ceramics; Journal of the American Ceramic Society; 2004; pp. 1932-1938; vol. 87.

Sheng, H., Emanetoglu, N.W., Muthukumar, S., Yakshinskiy, B.V., Feng, S., et al.; Ta/Au Ohmic Contacts to n_type ZnO; Journal of Electronic Materials; 2003; p. 935; vol. 32, No. 9.

Sheng, H., Emanetoglu, N.W., Muthukumar, S., Feng, S., and Lu, L.; Nonalloyed Al Ohmic Contacts to $Mg_xZn_{12x}O$; Journal of Electronic Materials; 2002; p. 811; vol. 31, No. 7.

Xiong, G., Wilkinson, J., Mischuck, B., Tüzemen, S., Ucer, K.B., et al; Control of p- and n-type conductivity in sputter deposition of undoped ZnO; Applied Physics Letters; Feb. 18, 2002; p. 1195; vol. 80, No. 7.

Yamamoto, T., and Katayama-Yoshida, H.; Unipolarity of ZnO with a wide-band gap and its solution using codoping method; Journal of Crystal Growth; 2000; pp. 552-555; vol. 214/215; Elsevier Science B.V.

Chang, R., Marks, T., Mason, T., and Poeppelmeir, K.; n/p-Type Transparent Conductors; pp. 259-260.

Olorunyolemi, T., Birnboim, A., Carmel, Y., Wilson, O.C., Lloyd, I.K.; Thermal Conductivity of Zinc Oxide: From Green to Sintered State; Journal of the American Ceramic Society; 2002; pp. 1249-1253; vol. 85.

Martin, L.P., and Rosen, M.; Correlation between Surface Area Reduction and Ultrasonic Velocity in Sintered Zinc Oxide Powders; Journal of the American Ceramic Society; 1997; pp. 839-846; vol. 80.

Wilkinson, J., Xiong, G., Ucer, K.B., and Williams, R.T.; Lifetime and Oscillator Strength of Excitonic Luminescence in Zinc Oxide.

Sekiguchi, T., Haga, K., and Inaba, K.; ZnO films grown under the oxygen-rich condition; Journal of Crystal Growth; 2000; pp. 68-71; vol. 214-215; Elsevier Science B.V.

Van De Walle, C.G.; Hydrogen as a Cause of Doping in Zinc Oxide; Physical Review Letters; Jul. 31, 2000; pp. 1012-1015; vol. 85, No. 5; The American Physical Society.

Kato, H., Sano, M., Miyamoto, K., and Yao, T.; Effect of O/Zn on Flux Ratio on Crystalline Quality of ZnO Films Grown by Plasma-Assisted Molecular Beam Epitaxy; Japanese Journal of Applied Physics; 2003; pp. 2241-2244; vol. 42; The Japan Society of Applied Physics.

Nakahara, K., Tanabe, T., Takasu, H., Fons, P., Iwata, K., et al.; Growth of undoped ZnO Films with Improved Electrical Properties by Radical Source Molecular Beam Epitaxy; Japanese Journal of Applied Physics; 2001; pp. 250-254; vol. 40; The Japan Society of Applied Physics.

Wang, X., Du, G., Gu, C., Jia, J., Li, X., et al.; Two-step growth of ZnO thin films on diamond/Si low-pressure metal-organic chemical vapour deposition; J. Phys. D: Appl. Phys.; 2002; pp. L74-L76; vol. 35; IOP Publishing Ltd., United Kingdom.

Han, J., Mantas, P.Q., and Senos, A.M.R.; Grain growth in Mn-doped ZnO; Journal of the European Seramic Society; 2000; pp. 2753-2758; vol. 20; Elsevier Science Ltd.

Fons, P., Iwata, K., Niki, S., Yamada, A., Matsubara, K., et al.; Uniaxial locked growth of high-quality epitaxial ZnO films on (1 1 2 0)$\alpha$-$Al_2O_3$; Journal of Crystal Growth; 2000; pp. 532-536; vol. 209; Elsevier Science B.V.

Haga, K., Kamidaira, M., Kashiwaba, Y., Sekiguchi, T., Watanabe, H.; ZnO thin films prepared by remote plasma-enhanced CVD method; Journal of Crystal Growth; 2000; pp. 77-80; vol. 214/215; Elsevier Science B.V.

Fons, P., Iwata, K., Niki, S., Yamada, A., and Matsubara, K.; Growth of high-quality epitaxial ZnO films on $\alpha$-$Al_2O_3$; Journal of Crystal Growth; 1999; pp. 627-632; vol. 201/202; Elsevier Science B.V.

Myoung, J.-M., Yoon, W-H., Lee, D-H., Yun, I., Bae, S-H., et al.; Effects of Thickness Variation of Properties of ZnO Thin Films Grown by Pulsed Laser Deposition; Japanese Journal of Applied Physics; 2002; pp. 28-31; vol. 41; The Japan Society of Applied Physics.

Yuldashev, S.U., Panin, G.N., Choi, S.W., Yalishev, V.S., Nosova, L.A., et al.; Electrical and Optical Properties of ZnO Films Grown on GaAs Substrates; Jpn. J. Appl. Phys; 2003; pp. 3333-3336; vol. 42; The Japan Society of Applied Physics.

Nonaka, M., Matsushima, S., Mizuno, M., Kobayashi, K.; Electronic Structure of Group III Elements Doped into ZnO by Using Molecular Orbital Calculation; Chemistry Letters; 2002; pp. 580-581; The Chemical Society of Japan.

Lin, G-R., and Wang, S-C.; Comparison of High-Resistivity ZnO Films Sputtered on Different Substrates; Japanese Journal of Applied Physics; 2002; pp. L398-L401; vol. 41; The Japan Society of Applied Physics.

Mantas, P.Q., and Baptista, J.L.; The Barrier Height Formation in ZnO Varistors; Journal of the European Ceramic Society; 1995; pp. 605-615; vol. 15; Elsevier Science Limited, Great Britain.

Albertsson, J., and Abrahams, S.C.; Atomic Displacement, Anharmonic Thermal Vibration, Expansivity and Pyroelectric Coefficient Thermal Dependences in ZnO; Acta Cryst.; 1989; pp. 34-40; vol. B45; International Union of Crystallography.

Blevins, J.D.; Wide Bandgap Semiconductor Substrates: Current Status and Future Trends.

Teke, A., Ozgur, U., Dogan, S., Gu, X., Morkoc, H., et al.; Excitonic fine structure and recombination dynamics in single-crystalline ZnO; Physical Review B; 2004; pp. 195207-1-195207-10; vol. 70; The American Physical Society.

Look, D.C., Reynolds, D.C., Litton, C.W., Jones, R.L., Eason, D.B., et al.; Characterization of homoepitaxial $p$-type ZnO grown by molecular beam epitaxy; Applied Physics Letters; Sep. 2, 2002; pp. 1830-1832; vol. 81, No. 10; American Institute of Physics.

Kim, K-K., Kim, H-S., Hwang, D-K., Lim, J-H., and Park, S-J.; Realization of $p$-type ZnO thin films via phosphorus doping and thermal activation of the dopant; Applied Physics Letters; Jul. 7, 2003; pp. 63-65; vol. 83, No. 1; American Institute of Physics.

Look, D.C.; Emerging Research Fonts Comments by David C. Look; ISI Essential Science Indicators; Apr. 28, 2005.

Senger, R.T., and Bajai, K.K.; Binding energies of excitons in polar quantum well heterostructures; Physical Review B; 2003; pp. 205314-1-205314-9; vol. 68; The American Physical Society.

Subramanyam, T.K., Naidu, B., and Uthanna, S.; Structure and Optical Properties of dc Reactive Magnetron Sputtered Zinc Oxide Films; Cryst. Res. Technol.; 1999; pp. 981-988; vol. 34.

Muth, J.F., Brown, J.D., Johnson, M.A.L., Yu, Z., Kolbas, R.M., et al.; Absorption coefficient and refractive index of GaN, AlN and AlGaN alloys; 1999; MRS Internet J. Nitride Semicond.

Yoshikawa, H., and Adachi, S.; Optical Constants of ZnO; Japanese Journal of Applied Physics; 1997; pp. 6237-6243; vol. 36.

Springer, J., Poruba, A., Vanecek, M., Fay, S., Feitknecht, L., et al.; Improved optical model for thin film silicon solar cells; Presented at $17^{th}$ European Photovoltaic Solar Energy Conference, Munich 2001.

Neethling, J.H., Scriven, G.J., and Krekels, T.; A TEM investigation of $Zn_3As_2$ grown on (001) and (111) InP by MOVPE; Journal of Materials Science; 2001; pp. 3997-4002; vol. 36; Kluwer Academic Publishers.

Brink, D.J., and Engelbrecht, A.A.; Ellipsometric investigation of rough zinc arsenide epilayers; Applied Optics; Apr. 1, 2002; pp. 1894-1898; vol. 41, No. 10; Optical Society of America.

Scriven, G.J., Leitch, A.W.R., Neethling, J.H., Kozyrkov, V.V., and Watters, V.J.; The growth of $Zn_3As_2$ on InP by atmospheric pressure MOVPE; Journal of Crystal Growth; 1997; pp. 813-816; vol. 170; Elsevier Science B.V.

Engelbrecht, J.A.A., Scriven, G.J., Neethling, J.H., and Wagener, M.C.; Crack formation in $Zn_3As_2$ epilayers grown by MOVPE; Journal of Crystal Growth; 2000; pp. 235-244; vol. 216; Elsevier Science B.V.

Norman, A.G., Olson, J.M., Romero, M.J., and Al-Jassim, M.M.; Electron Microscopy Studies of Potential 1-eV Bandgap Semiconductor Compounds $AnGeAs_2$ and $Zn_3As_2$ Grown by MOVPE; National Renewable Energy Laboratory.

Miles, G.C., and West, A.R.; Polymorphism and Thermodynamic Stability of $Zn_7Ab_2O_{12}$; Journal of the American Ceramic Society; 2005; pp. 396-398; vol. 88.

Tomlins, G.W. Routbort, J.L., and Mason, T.O.; Oxygen Diffusion in Single-Crystal Zinc Oxide; Journal of the American Ceramic Society; 1998; pp. 869-876; vol. 81.

Botha, J.R., Scriven, G.J., Engelbrecth, J.A.A., and Leitch, A.W.R.; Photoluminescence properties of metalorganic vapor phase epitaxial $Zn_3As_2$; Journal of Applied Physics; Nov. 15, 1999; pp. 5614-5618; vol. 86, No. 10; American Institute of Physics.

Xiong, G., Wilkinson, J., Mischuck, B., Tuzemen, S., Ucer, K.B., et al.; Control of $p$- and $n$-type conductivity in sputter deposition of undoped ZnO; Applied Physics Letters; Feb. 18, 2002; pp. 1195-1197; vol. 80, No. 7; American Institute of Physics.

Look, D.C., Renlund, G.M., Burgener, II, R.H., and Sizelove, J.R.; As-doped p-type ZnO produced by an evaporation/sputtering process; Applied Physics Letters; Nov. 2004; vol. 85.

Aoki, T. Shimizu, Y., Miyake, A., Nakamura, A., Nakanishi, Y., and Hatanaka, Y.; p- Type ZnO Layer Formation by Excimer Laser Doping; phys. stat. sol.; 2002; pp. 911-914; vol. 229, No. 2; Wiley-VCh Verlag Berlin GmbH, Berlin.

Lee, J-M., Kim, K.K., Park, S-J., and Choi, W.K.; Low-resistance and non-alloyed ohmic contacts to plasma treated ZnO; Applied Physics Letters; Jun. 11, 2001; pp. 3842-2844; vol. 78, No. 24; American Institute of Physics.

Yamamoto, T.; Codoping Method to Realize Low-Resistivity $p$-type ZnO Thin Films; Asia Display/IDW '01, Oct. 16-19, 2001, Nagoya, Oct. 18, PH1-2.

Nakahara, K., Takasu, H., Fons, P., Yamada, A., Iwata, K., et al.; Growth of N-doped and Ga+N-codoped ZnO films by radical source molecular beam epitaxy; Journal of Crystal Growth; 2002; pp. 503-508; vol. 237-239; Elsevier Science B.V.

Recnik, A., Daneu, N., Walther, T., and Mader, W.; Structure and Chemistry of Basal-Plane Inversion Boundaries in Antimony Oxide-Doped Zinc Oxide; Journal of the American Ceramic Society; 2001; pp. 2357-2668; vol. 84.

Nonaka, M., Matsushima, S., Mizuno, M., and Kobayashi, K.; Electronic Structure of Group III Elements Doped into ZnO by Using Molecular Orbital Calculation; Chemistry Letters; 2002; pp. 580-581; The Chemical Society of Japan.

Ryu, Y.R., Kim, W.J., and White, H.W.; Fabrication of homostructural ZnO p-n junctions; Journal of Crystal Growth; 2000; pp. 419-422; vol. 219; Elsevier Science B.V.

Lu, J., Ye, Z., Wang, L., Huang, J., and Zhao, B.; Structural, electrical and optical properties of N-doped ZnO films synthesized by SS-CVD; Materials Science in Semiconductor Processing; 2003; pp. 491-496; vol. 5; Elsevier Science Ltd.

Zhenguo, J., Kun, L., Chengxing, Y., Ruixin, F., and Zhizhen, Y.; Structural, optical and electrical properties of ZnO thin films prepared by reactive deposition; Journal of Crystal Growth; 2003; pp. 246-251; vol. 253; Elsevier Science B.V.

Ji, Z., Yang, C., Liu, K., and Ye, Z.; Fabrication and characterization of p-type ZnO films by pyrolysis of zinc-acetate—ammonia solution; Journal of Crystal Growth; 2003; pp. 239-242; vol. 253; Elsevier Science B.V.

Ye, Z-Z., Lu, J-G., Chen, H-H., Zhang, Y-Z., Wang, L., et al.; Preparation and characteristics of p-type ZnO films by DC reactive magnetron sputtering; Journal of Crystal Growth; 2003; pp. 258-264; vol. 253; Elsevier Science B.V.

Minegishi, K., Koiwai, Y., Kikuchi, Y., Yano, K., Kasuga, M., et al.; Growth of p-type Zinc Oxide Films by Chemical Vapor Deposition; Japanese Journal of Applied Physics; 1997; pp. L 1453-L 1455; vol. 36.

Joseph, M., Tabata, H., and Kawai, T.; p-Type Electrical Conduction in ZnO Thin Films by Ga and N Codoping; Japanese Journal of Applied Physics; 1999; pp. L 1205-L 1207; vol. 38; Publication Board, Japanese Journal of Applied Physics.

Ashrafi, A.B.M.A., Suemune, I., Kumano, H., and Tanaka, S.; Nitrogen-Doped p-Type ZnO Layers Prepared with $H_2O$ Vapor-Assisted Metalorganic Molecular-Beam Epitaxy; Japanese Journal of Applied Physics; 2002; pp. L 1281-L 1284; vol. 41; The Japan Society of Applied Physics.

The Promise of Solid State Lighting for General Illumination: Light Emitting Diodes (LEDs) and Organic Light Emitting Diodes (OLEDs); 2001; pp. 1-29; Optoelectronics Industry Development Association, Washington, D.C.

Talbot, D.; LEDs vs. the Light Bulb; Technology Review; May 2003; pp. 30-36.

Johnson, S.; LEDs—An Overview of the State of the Art in Technology and Application; Light Right 5 Conference, May 27-31, 2002, Nice, France.

Tuzemen, S., Xiong, G., Wilkinson, J., Mischick, B., Ucer, K.B., et al.; Production and properties of p-n junctions in reactively sputtered ZnO; Physica B; 2001; pp. 1197-1200; vol. 308-310; Elsevier Science B.V.

Guo, X-L., Choi, J-H., Tabata, H., and Kawai, T.; Fabrication and Optoelectronic Properties of a Transparent ZnO Homostructural Light-Emitting Diode; Japanese Journal of Applied Physics; 2001; pp. L 177-L 180; vol. 40; The Japan Society of Applied Physics.

Jadwisienczak, W.M., Lozykowski, H.J., Xu, A., and Patel, B.; Visible Emission from ZnO Doped with Rare-Earth Ions; Journal of Electronic Materials; 2002; pp. 776-784; vol. 31.

Xiong, G., Wilkinson, J., Tuzemen, S., Ucer, K.B., and Williams, R.T.; Toward a new ultraviolet diode laser: luminescence and p-n junctions in ZnO films.

Hoffman, R.L., Norris, B.J., and Wager, J.F.; ZnO-based transparent thin-film transistors; Applied Physics Letters; Feb. 3, 2003; pp. 733-735; vol. 82, No. 5; American Institute of Physics.

Bockowshi, M.; Growth and Doping of GaN and AlN Single Crystals under High Nitrogen Pressure; Cryst. Res. Technol.; 2001; pp. 771-787; vol. 36; Wiley-VCH Verlag Berlin GmbH, Berlin.

Katayama-Yoshida, H., Sato, K., and Yamamoto, T.; Materials design for new functional semiconductors by *ab initio* electronic structure calculation: Prediction vs. experiment; JSAP International; Jul. 2006; pp. 20-27; No. 6.

Mukai, T., Morita, D., and Nakamura, S.; High-power UV InGaN/AlGaN double-heterostructure LEDs; Journal of Crystal Growth; 1998; pp. 778-781; vol. 189/190; Elsevier Science B.V.

Xing, H., Green, D.S., McCarthy, L., Smorchkova, I.P., Chavarkar, P., et al.; Progress in Gallium Nitride-based Bipolar Transistors.

Piprek, J., and Nakamura, S.; nano-Scale Effects in GaN-based Light-Emitting Diodes; 2004.

Piprek, J.; Simulation of GaN-based Light-Emitting Devices; 2004.

Bunea, G.E., Herzog, W.D., Unlu, M.S., Goldberg, B.B., and Molnar, R.J.; Time-resolved photoluminescence studies of free and donor-bound exciton in GaN grown by hydride vapor phase epitaxy.

Yao, T.; Plasma-Assisted MBE Growth of ZnO; Molecular Beam Epitaxy; pp. 98-105.

Chapter 2 Geometric Structure of Metal Oxides; pp. 55-58.

Chapter 4 Electronic Structure of Non-Transition-Metal-Oxide Surfaces; pp. 143-150.

Ip, K., Khanna, R., Norton, D.P., Pearton, S.J., Ren, F., et al.; Thermal Stability of Tungsten-Based Schottky Contacts to N-Type ZnO.

Look, D.C., Claflin, B., Alivov, Y.I., and Park, S.J.; The future of ZnO light emitters; phys. stat. sol.; 2004.

Itani, Kenya, et al., "Low-Dislocation-Density GaAs Wafers Grown by Vertical Gradient Freeze Process, Suitable for Mass Production of Semiconductor Lasers," Hitachi Cable Review No. 20, Aug. 2001, pp. 35-38.

Pearton, S.J., et al. "Wide Band Gap Ferromagnetic Semiconductors and Oxides," Journal of Applied Physics vol. 93, No. 1, Jan. 1, 2003, pp. 1-13.

Web Page '99 SBIR Phase I . . . Topic 14—Electronic Materials, http://www-ee.eng.buffalo.edu/faculty/paololin/492/semicon.pdf, "Low-Temperature Hydrothermal Growth of Zno for Semiconductor Substrates," Feb. 26, 2004, 2 pages.

Web Page "Semiconductor Photonics", 3 pages.

Renlund, Gary M., et al., "Silicon Oxycarbide Glasses: Part I. Preparation and Chemistry," J. Mater. Res. vol. 6, No. 12, Dec. 1991, pp. 2716-2722.

Renlund, Gary M., et al. "Silicon Oxycarbide Glasses: Part II. Structure and Properties," J. Mater. Res. vol. 6, No. 12, Dec. 1991, pp. 2723-2734.

* cited by examiner

Insulator

Semiconductor

LOW DIELECTRIC CONSTANT GROUP II-VI INSULATOR

CROSS REFERENCE TO RELATED APPLICATION

This application claims the benefit of U.S. Provisional Application No. 60/580,454, filed Jun. 17, 2004, which application is incorporated by reference.

BACKGROUND OF THE INVENTION

The present invention provides low dielectric constant zinc oxide semiconductors, low dielectric constant zinc oxide insulators, and to fabrication methods thereof.

Since the introduction of the transistor, the semiconductor industry has seen an unprecedented rate of change in manufacturing productivity and device performance. The semiconductor industry is approaching a point at which conventional silicon dioxide dielectrics are inadequate for the function of insulating metal interconnects as the scale of integration and device speed increases. As integrated circuit (IC) dimensions continue to decrease, resistance-capacitance delay (RC delay), crosstalk noise, and power dissipation of the interconnect structure become limiting factors for ultra-large-scale integration of integrated circuits. Materials with low dielectric constant are desirable to replace silicon dioxide as inter-level dielectrics.

What is needed is an insulator with a lower dielectric constant (expressed as k value) than silicon dioxide. As used herein, a low-k dielectric is a dielectric material featuring a dielectric constant lower than that of $SiO_2$. A dielectric is a solid that exhibits insulating properties. It typically has its upper most energy band completely empty which results in extremely low conductivity. The most common dielectrics in semiconductor technology are $SiO_2$ and $Si_3N_4$. Low k dielectrics are used to insulate adjacent metal lines (interlayer dielectric, ILD) in advanced integrated circuits. The low k value reduces undesired capacitive coupling, and hence "cross talk" between lines.

Zinc oxide (ZnO), zinc sulfide (ZnS), and magnesium oxide (MgO) are wide band gap semiconductors with potential for use in electrically excited devices such as light emitting devices (LEDs), laser diodes (LDs), field effect transistors (FETs), photodetectors operating in the ultraviolet and at blue wavelengths of the visible spectrum, and other similar devices. Zinc oxide, zinc sulfide, and magnesium oxide are examples of group II-VI semiconductors compound.

As used herein, group II-VI semiconductor compounds include group II elements selected from zinc, cadmium, the alkaline earth metals such as beryllium, magnesium calcium, strontium, and barium, and mixtures thereof, and group VI elements selected from oxygen, sulfur, selenium, tellurium, and mixtures thereof. The group II-VI semiconductor compounds may be doped with one or more p-type dopant. Such p-type dopants include, but are not limited to, nitrogen, phosphorus, arsenic, antimony, bismuth, copper, chalcogenides of the foregoing, and mixtures thereof. The group II-VI semiconductor compounds may be doped with one or more n-type dopants. Such n-type dopants include, but are not limited to, ions of Al, Ga, B, H, Yb and other rare earth elements, Y, Sc, and mixtures thereof.

N-type zinc oxide semiconductor materials are known and relatively easy to prepare, such as ZnO doped with aluminum, gallium, or other known n-type dopants. P-type zinc oxide semiconductor materials are theoretically possible, but have been difficult to prepare. D. C. Look et al., "The Future of ZnO Light Emitters," Phys. Stat. Sol., 2004, summarize data on p-type ZnO samples reported in the literature. The best reported ZnO samples have resistivity values of 0.5 ohm·cm (N/Ga dopants) and 0.6 ohm·cm (P dopant). Many of the reported p-type zinc oxide samples tend to be light, heat, oxygen, and moisture sensitive. Some convert to n-type material over time. Their stability has been questioned and instability has been observed. Some of the more-stable p-type zinc oxide materials reported in the literature are prepared using complex and expensive fabrication processes, such as molecular beam epitaxy. No commercially viable p-type zinc oxide semiconductor materials are currently known.

Without being bound by theory, it is presently believed one possible explanation for the lack of p-type zinc oxide materials is because high temperature diffusion processes or other fabrication methods inhibit formation of desirable p-type zinc oxide compounds. In particular, it is presently believed that high temperature fabrication of p-type zinc oxide transforms the zinc oxide from a semiconductor to an insulator.

BRIEF DESCRIPTION OF THE SEVERAL VIEWS OF THE DRAWINGS

A more particular description of the invention briefly described above will be rendered by reference to specific embodiments thereof which are illustrated in the appended drawings. These drawings depict only typical embodiments of the invention and are not therefore to be considered to be limiting of its scope. The invention will be described and explained with additional specificity and detail through the use of the accompanying drawings in which:

FIGS. 1A and 1B do not show the coordination of the ions. As the dopant enters the ZnO structure, it will either increase the coordination numbers or increase bond strength. In this case, full strength bonds and the dopant, As, on the anion site are assumed in both figures.

DETAILED DESCRIPTION OF THE INVENTION

The present invention is directed to low dielectric constant zinc oxide semiconductors, low dielectric constant zinc oxide insulators, and to fabrication methods thereof.

Prior pending U.S. patent application Ser. Nos. 10/849,332, 10/849,345, 10/849,347, and 10/849,348, filed May 19, 2004, are incorporated by reference. These applications disclose methods and apparatus for the fabrication of p-type group II-VI semiconductors, p-type group II-VI semiconductor compounds, group II-VI semiconductor devices, and crystal growth substrates. The inventions disclosed in these prior patent applications may be adapted for use within the scope of the present invention.

Persistent p-type zinc oxide is fabricated using techniques that do not require diffusion of the p-type dopant. When properly fabricated, the dopant ion in the zinc oxide structure is surprisingly stable and does not move through diffusion. Indeed, if diffusion were to occur, the structure would not be stable. Without being bound by theory, it is presently believed this is due to a bonding restriction that allows the p-type zinc oxide to form. In the case of arsenic as the p-type dopant, there are no, or a limited number, of As—O bonds in the p-type arsenic-doped zinc oxide crystal lattice. If As—O bonds were to form, a low stability As—O compound would form that would render the zinc oxide structure less stable. Bonding restrictions of this kind are known in connection with carbon doping of silica. J. Mater. Res., Vol. 6, No. 12, December 1991.

While the foregoing discussion relates to arsenic doped zinc oxide, it is believed the bonding restrictions seen with As—O involve other group 5 oxides, and also include group 5 chalcogenides. Moreover, while much of the discussion herein relates to arsenic doped zinc oxide, the invention includes the use of other p-type dopants, including, but not limited to N, P, Sb, and Bi.

Figure 1A:
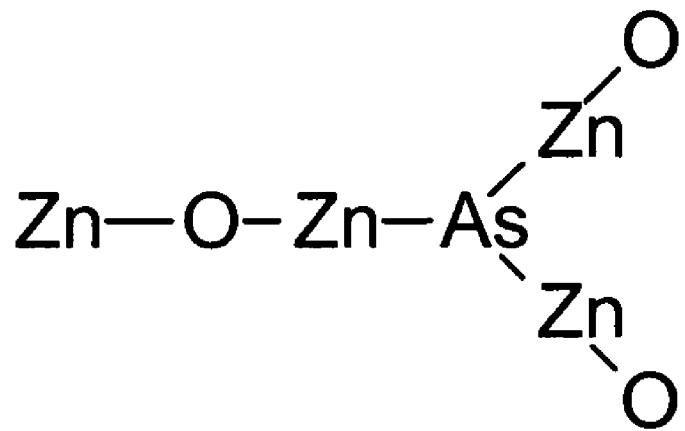
FIG. 1A is a chemical representation of arsenic doped zinc oxide which is an insulator, with low dielectric constant properties.
Figure 1B:
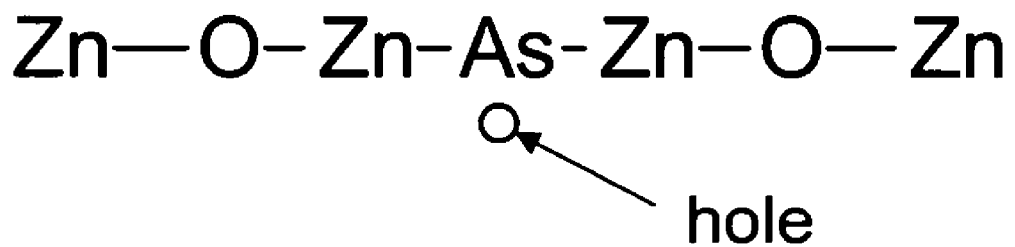
FIG. 1B is a chemical representation of arsenic doped zinc oxide which is a semiconductor.

FIG. 1B is a chemical representation of arsenic doped zinc oxide with semiconductor properties. At arsenic concentrations in the range from about $10^{16}$ to about $10^{20}$ atoms/cm$^3$, arsenic substitution for oxygen in zinc oxide creates a hole which results in p-type properties. FIG. 1A is a chemical representation of arsenic doped zinc oxide at high arsenic concentrations, such as about 1 mole %. In this situation, the arsenic alters the zinc oxide crystal lattice in a manner such that the zinc oxide possesses insulating properties with a low dielectric constant. In addition, it is believed exposure to high temperatures causes a third coordinated arsenic branch to form, resulting in a lower dielectric constant, semi-insulating to fully insulating material.

While the foregoing discussion relates to arsenic doped zinc oxide, other p-type dopants such as N, P, and Sb produce the same effect. It is believed that nitrogen dopant produces the most efficient reduction in dielectric constant due to its rigid outer electron shells.

A low dielectric constant zinc oxide insulator material may be fabricated by doping the zinc oxide with dopant ions and where the dopant ion has a concentration of at least 1 mole %. Examples of suitable dopant ions include, but are not limited to, group 4 and 5 ions. It is believed that doping zinc oxide with p-type dopant ions that substitute for oxygen and that have a concentration of at least $10^{18}$ to $10^{19}$ atoms/cm$^3$ (but lower than 1 mole %) lowers the dielectric constant of the zinc oxide, but not renders the material insulating. This may have useful advantages in producing low dielectric semiconductor materials.

Based upon experimental observation, if zinc oxide doped with p-type dopant ions at a concentration of about $10^{18}$ to $10^{19}$ atoms/cm$^3$ is heated above about 450° C. for a time period greater than about 10 minutes, the zinc oxide appears to become less semiconducting and more insulating or semi-insulating. Above about 450° C. the material films remain intact, but chemical reactions occur where the electrical resistance increases and the dielectric constant decreases. Without being bound by theory, it is believed the heating transforms the semiconducting structure 1B into the insulating structure 1A, while maintaining overall X-ray diffraction detectable crystal integrity.

From experimental observation of antimony-doped zinc oxide, the p-type characteristics for antimony remain stable up to about 650° C. Changes in processing conditions can cause a third coordinated antimony branch, similar to FIG. 1A, forming a lower dielectric constant that produces a semi-insulating to fully insulating material.

The temperature at which the p-type zinc oxide is converted to an insulating structure varies depending upon the p-type dopant. For antimony the temperature is about 650° C. For arsenic the temperature is about 450° C. It is believed the conversion temperature is lower than 450° C. for P and N dopants.

EXAMPLES

The following examples are given to illustrate various embodiments within the scope of the present invention. These are given by way of example only, and it is to be understood that the following examples are not comprehensive or exhaustive of the many embodiments within the scope of the present invention.

Example 1

A low dielectric zinc oxide insulator material is fabricated by obtaining zinc oxide doped with arsenic at a dopant concentration of about ¼ mole %. The arsenic-doped zinc oxide possesses p-type semiconductor properties. The arsenic-doped zinc oxide is heated to a temperature greater than about 450° C. for a time period of about 10 minutes. The resulting arsenic-doped zinc oxide has been converted to an insulator and has a low dielectric constant.

Example 2

A low dielectric zinc oxide insulator material is fabricated by obtaining zinc oxide doped with arsenic at a dopant concentration of at least $10^{18}$ atoms/cm$^3$. The arsenic-doped zinc oxide possesses p-type semiconductor properties. The arsenic-doped zinc oxide is heated to a temperature greater than about 450° C. for a time period of about 10 minutes. The resulting arsenic-doped zinc oxide has been converted to an insulator and has a low dielectric constant.

Example 3

A low dielectric zinc oxide insulator material is fabricated by obtaining zinc oxide doped with antimony at a dopant concentration of at least $10^{18}$ atoms/cm$^3$. The antimony-doped zinc oxide possesses p-type semiconductor properties. The antimony-doped zinc oxide is heated to a temperature greater than about 650° C. for a time period of about 10 minutes. The resulting antimony-doped zinc oxide has been converted to an insulator and has a low dielectric constant.

Example 4

This example describes a method of lowering the dielectric constant of zinc oxide. Undoped zinc oxide has a dielectric constant of about 8.7. The dielectric constant of the zinc oxide is lowered by fabricating zinc oxide under conditions in which the zinc oxide is doped with arsenic or antimony at a dopant concentration of about $10^{21}$ atoms/cm$^3$. The resulting arsenic or antimony-doped zinc oxide has a dielectric constant less than 8.7. This material may be used as gate in a FET.

Example 5

A low dielectric constant zinc oxide insulator material is fabricated by obtaining zinc oxide doped with arsenic at a dopant concentration greater than 1 mole %. The resulting arsenic-doped zinc oxide has a low resistivity is effective as an insulator. It also possesses a low dielectric constant.

While the foregoing discussion relates to zinc oxide materials, the invention is not limited to zinc oxide materials. The principles and theories within the scope of the present invention apply generally to group II-VI semiconductor materials.

The present invention may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

The invention claimed is:

1. A method of fabricating a low dielectric constant group II-VI insulator material comprising:

obtaining a group II-VI material comprising atoms of group II elements and atoms of group VI elements and a p-type dopant that substitutes for atoms of the group VI element, wherein the dopant has a concentration of at least about ¼ mole % in the group II-VI material; and heating the group II-VI material for a time period of at least 10 minutes at a temperature sufficient to convert the group II-VI material to a low dielectric constant insulator.

2. The method according to claim 1, wherein the group II-VI material is zinc oxide.

3. The method according to claim 2, wherein the dopant is arsenic and the temperature is about 450° C.

4. The method according to claim 2, wherein the dopant is antimony and the temperature is about 650° C.

5. The method according to claim 2, wherein the dopant is selected from the group consisting of nitrogen, phosphorus, arsenic, and antimony.

6. The method according to claim 2, wherein the dopant is selected from the group consisting of arsenic and antimony.

7. The method according to claim 1, wherein the dopant has a concentration of at least 1 mole % in the group II-VI material.

8. The method according to claim 2, wherein the dopant has a concentration greater than 1 mole % in the zinc oxide material.

* * * * *